United States Patent
Anshumali et al.

(10) Patent No.: US 6,864,733 B2
(45) Date of Patent: Mar. 8, 2005

(54) DATA-ENABLED STATIC FLIP-FLOP CIRCUIT WITH NO EXTRA FORWARD-PATH DELAY PENALTY

(75) Inventors: Kumar Anshumali, Hillsboro, OR (US); Tom Fletcher, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/446,733

(22) Filed: May 29, 2003

(65) Prior Publication Data

US 2004/0239393 A1 Dec. 2, 2004

(51) Int. Cl.[7] .............................................. H03K 3/356
(52) U.S. Cl. ...................... 327/210; 327/211; 327/218
(58) Field of Search ................................ 327/202, 203, 327/208, 209, 210, 211, 212, 218; 326/46, 95

(56) References Cited

U.S. PATENT DOCUMENTS

| | | | | |
|---|---|---|---|---|
| 5,105,100 A | * | 4/1992 | Yamada | 327/202 |
| 5,719,878 A | * | 2/1998 | Yu et al. | 714/726 |
| 5,938,782 A | * | 8/1999 | Kay | 714/726 |
| 6,097,230 A | * | 8/2000 | Bareither | 327/202 |
| 6,538,471 B1 | * | 3/2003 | Stan et al. | 326/46 |
| 6,661,270 B2 | * | 12/2003 | Nagata | 327/202 |
| 6,753,714 B2 | * | 6/2004 | Gupta | 327/202 |

FOREIGN PATENT DOCUMENTS

| | | | |
|---|---|---|---|
| DE | 3443788 | * | 6/1986 |
| DE | 3428393 | * | 8/1994 |
| JP | 2-246610 | * | 10/1992 |

* cited by examiner

*Primary Examiner*—Tuan T. Lam
(74) *Attorney, Agent, or Firm*—Fleshner & Kim, LLP

(57) ABSTRACT

A logic circuit includes a data-enable controller for outputting a data value. When implemented as a master-slave flip-flop, a data enable signal controls the activation of a master stage of the flip-flop in conjunction with the transitioning edge of an input clock signal. The data enable signal also controls the feedback of a logical value stored in the slave stage to a storage node of the master stage. Operation of the slave stage may be controlled by the input clock signal only. Through this structural configuration, the flip-flop or latch outputs logical values without requiring any additional forward-path delay elements. As a result, these devices are faster and more efficient than conventional circuits.

47 Claims, 4 Drawing Sheets

US 6,864,733 B2

DATA-ENABLED STATIC FLIP-FLOP CIRCUIT WITH NO EXTRA FORWARD-PATH DELAY PENALTY

BACKGROUND OF THE INVENTION

1. Field of the Invention

This invention generally relates to electronic circuits, and more particularly to flip-flops, latches, and/or other forms of logic circuits as well as methods of controlling the same.

2. Description of the Related Art

Logic devices are important components of integrated circuits. They are used, for example, as registers for storing data and instructions as well as for performing logical operations on a variety of signals. Two common logic devices uses in microprocessor design are flip-flops and latches.

Flip-flops may be classified as static or dynamic. Dynamic flip-flops operate in two stages, namely a precharge stage followed by an evaluate stage. In the precharge stage, a capacitor is precharged to high. In the evaluate stage, its output is evaluated and if the actual output is low the capacitor discharges. Dynamic flip-flops have the advantage of speed, however they consume a significant amount of power and have circuit complexity. Static latches, on the other hand, consume less power, have a simpler design, and possess better noise immunity, clock skew and tolerance compared with dynamic flip-flops. However, they tend to be slower.

Static flip-flops may be classified into several types, one of which is referred to as a master-slave flip-flop. Master-Slave flip-flops include two identical, cascaded flip-flop stages with complementary clock inputs. The first stage is referred as the "master" and the second stage the "slave." In a first portion of a clock cycle, the master is activated to receive a data input value. The slave is disabled during this time, maintaining its previous output value. In a second portion of a clock cycle, the master is disabled and the slave is activated. During this time, the slave receives the output of the master and this value is passed as the output of the flip-flop. General speaking, master-slave flip-flops have better race immunity and consume lesser power than edge-triggered and other types of flip-flops.

Latches are made from the same basic circuit as flip-flops. However, the two differ based on the manner in which they are activated. For example, a latch may be a level-triggered device while a flip-flop may be an edge-triggered based on the transitions of an input clock signal.

Improving efficiency of flip-flops, latches, and other forms of logic circuits is a primary concern for VLSI design engineers.

DESCRIPTION OF THE PREFERRED EMBODIMENTS

Figure 1:
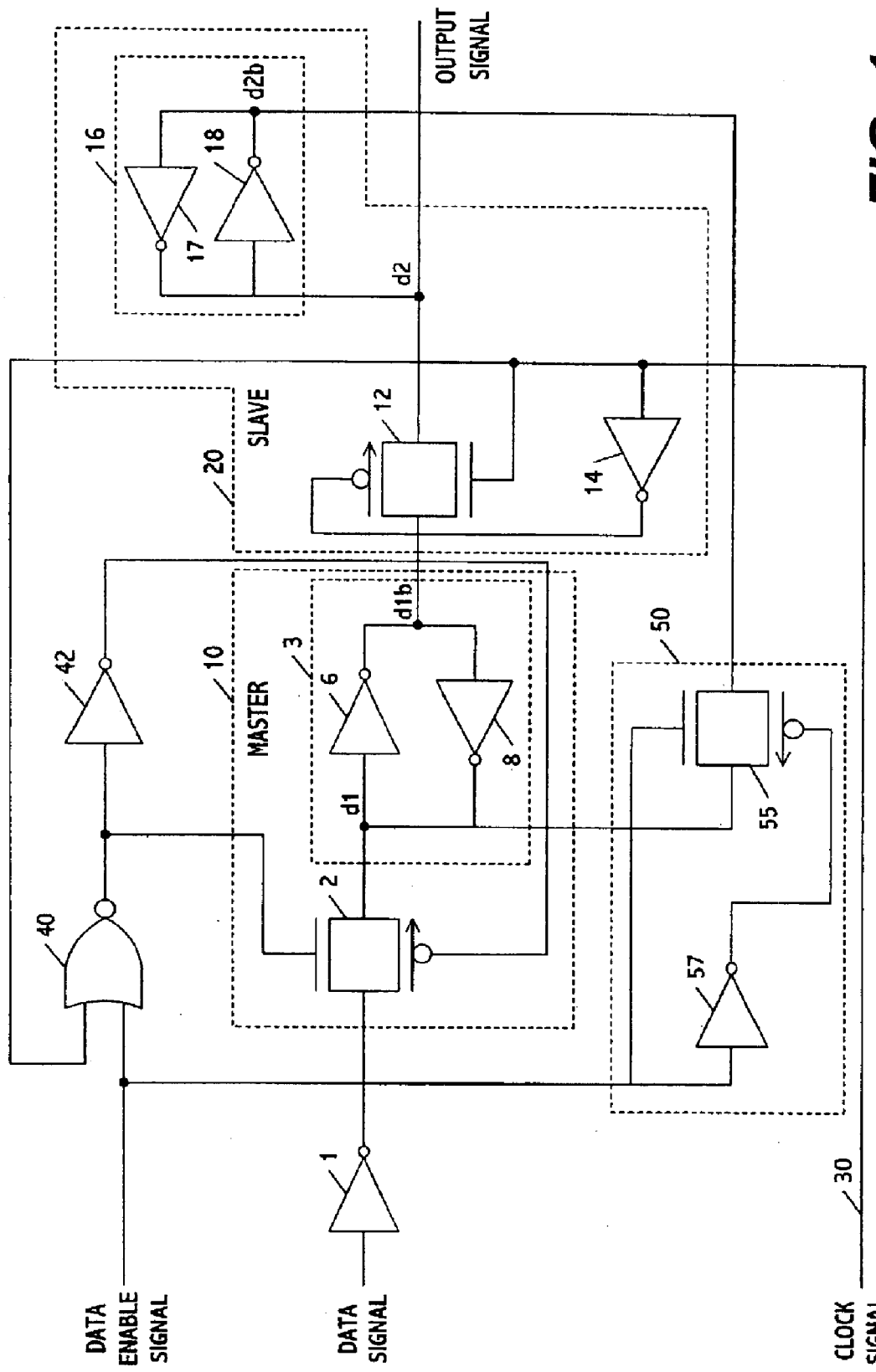
FIG. 1 is a diagram showing a flip-flop having a data-enabled control circuit in accordance with one embodiment of the present invention.

Referring to FIG. 1, a static flip-flop circuit in accordance with one embodiment of the present invention includes a master stage 10, a slave stage 20, and a data-enable control circuit. The master stage includes a transmission gate 2 and a keeper circuit 3. The transmission gate has an input connected to an inverter 1 which inverts an input data signal. The output of this gate is connected to the keeper circuit which is formed from inverters 6 and 8 connected in a loop. While in this embodiment the master stage is implemented using a transmission gate, those skilled in the art can appreciate that alternative designs are possible. For example, the master stage may be implemented entirely in CMOS logic or may have a totem-pole configuration, the latter of which is illustratively shown in FIG. 3 discussed in greater detail below.

The slave stage includes a transmission gate 12, an inverter 14, and a keeper circuit 16. Transmission gate 12 has an input connected to the keeper circuit of the master stage and an output which corresponds to an output of the flip-flop circuit. The keeper circuit is formed from inverters 17 and 18 connected in a loop. One node d2 of the keeper is connected to the output of transmission gate 12, and an opposing inverted node d2b is connected to the output of a transmission gate included in the data-enable control circuit.

The data-enable control circuit synchronizes operation of the master and slave stages of the flip-flop circuit in association with a clock signal input along signal line 30. The data-enable control circuit includes a logic gate 40 and an inverter 42. The logic gate is preferably a NOR gate which includes as inputs a data enable signal and the input clock signal from line 30. Inverter 42 inverts the output of the NOR gate. Together, the outputs of the NOR gate and inverter 42 control whether transmission gate 2 passes the inverted data input signal for storage into the master keeper circuit. Put differently, the respective states of the data enable and clock signals control the operation of the master stage of the flip-flop circuit. The clock signal also controls when transmission gate 12 passes the logical value stored in the master keeper to the flip-flop output. This function may be performed independently from the data-enable signal. While the logic gate of the data-enable control circuit is shown as a NOR gate, those skilled in the art can appreciate that other logic gates or circuits may be used provided they perform at least a substantially equivalent function.

The flip-flop circuit may also include a feedback control circuit 50 which connects the slave keeper to the master keeper. The feedback control circuit includes an inverter 57 and a transmission gate 55, the operation of which is controlled by the data enable signal input into the data-enable control circuit. This transmission gate has an input connected to the d2b node of the slave keeper and an output connected to the d1 node of the master keeper.

In the foregoing embodiment, the transmission gate may be any type conventionally known. For example, the transmission gate may be made from NMOS and PMOS transistors with their sources and drains connected.

The keeper circuits described above effectively function as memory elements. The feedback structure of these circuits ensures that whatever value is written to a corresponding node when the transmission gate is on does not disappear when the transmission gate is turned off. For example, in keeper circuit 3 if the value output from transmission gate 2 corresponds to a logical zero, node d1 will also be pulled down to zero when the transmission gate turns off. This, in turn, causes node d1b to rise to a logical one value, which then feeds back through inverter 8 which again produces a logical zero at node d1. Through this keeper structure, the value output from the transmission gate will be maintained even after this gate is turned off. The inverters in the keeper structure may be made very weak (e.g., small transistor sizes) so that they can be overpowered by the transmission gate and therefore the value stored at its node can be changed. On the other hand, the inverters are made strong enough so that even if there is leakage at node d1 or d1b, or noise coupled to these nodes from other circuits, the stored value will not be corrupted.

Operation of the static flip-flop circuit will now be discussed for each of the four possible logical values the data enable and clock signals may assume.

When the clock and data enable signals are both low (e.g., logical zero), the output of NOR gate 40 is high (e.g., logical one). This value is input into the non-inverting terminal of transmission gate 2 and a logical zero value is input into the inverting terminal of this transmission gate as a result of the output from inverter 42. These values cause the transmission gate to pass the inverted data signal output from inverter 1 to node d1, where it is maintained by keeper circuit 3 of the master portion of the flip-flop. Because the clock signal is low, transmission gate 12 is not activated and thus does not pass the inverted logical value stored at node d1b to the output of the flip-flop. Also, because the data-enable signal is low, transmission gate 55 is not activated and thus does not pass the logical value stored at keeper circuit 16 of the slave portion of the flip-flop to node d1.

When the clock signal transitions from low to high while the data enable signal is low, the output of the NOR gate is a logical zero which causes the transmission gate 2 to become de-activated. However, a logical value of one is input into the non-inverting terminal of transmission gate 12 and a logical value of zero is input into the inverting terminal of this gate. As a result, the inverted logical value stored at node d1b is passed from the slave portion of the circuit to node d2, which corresponds to the output of the flip-flop. The logical value at node d2 is stored in keeper circuit 16 of the slave, however because the data enable signal is low transmission gate 55 remains de-activated and the logical value stored in the slave keeper is not fed back to node d1 of the master keeper.

When the clock signal transitions from low to high while the data enable signal is high, the output the NOR gate is a logical zero which causes the transmission gate to become de-activated. However, a logical value of 1 is input into the non-inverting terminal of transmission gate 12 and a logical value of zero is input into the inverting terminal of this gate. As a result, the inverted logical value stored at node d1b is passed from the slave portion of the circuit to node d2, which corresponds to the output of the flip-flop. The logical value at node d2 is stored in keeper circuit 16 of the slave. Because the data enable signal is high, a logical one is input into the non-inverting terminal of transmission gate 55 is activated and a logical zero is input into the inverting terminal of this gate. As a result, transmission gate 55 is activated, thereby feeding back the inverted value stored in slave keeper circuit 16 to node d1 of the master keeper.

Figure 2:
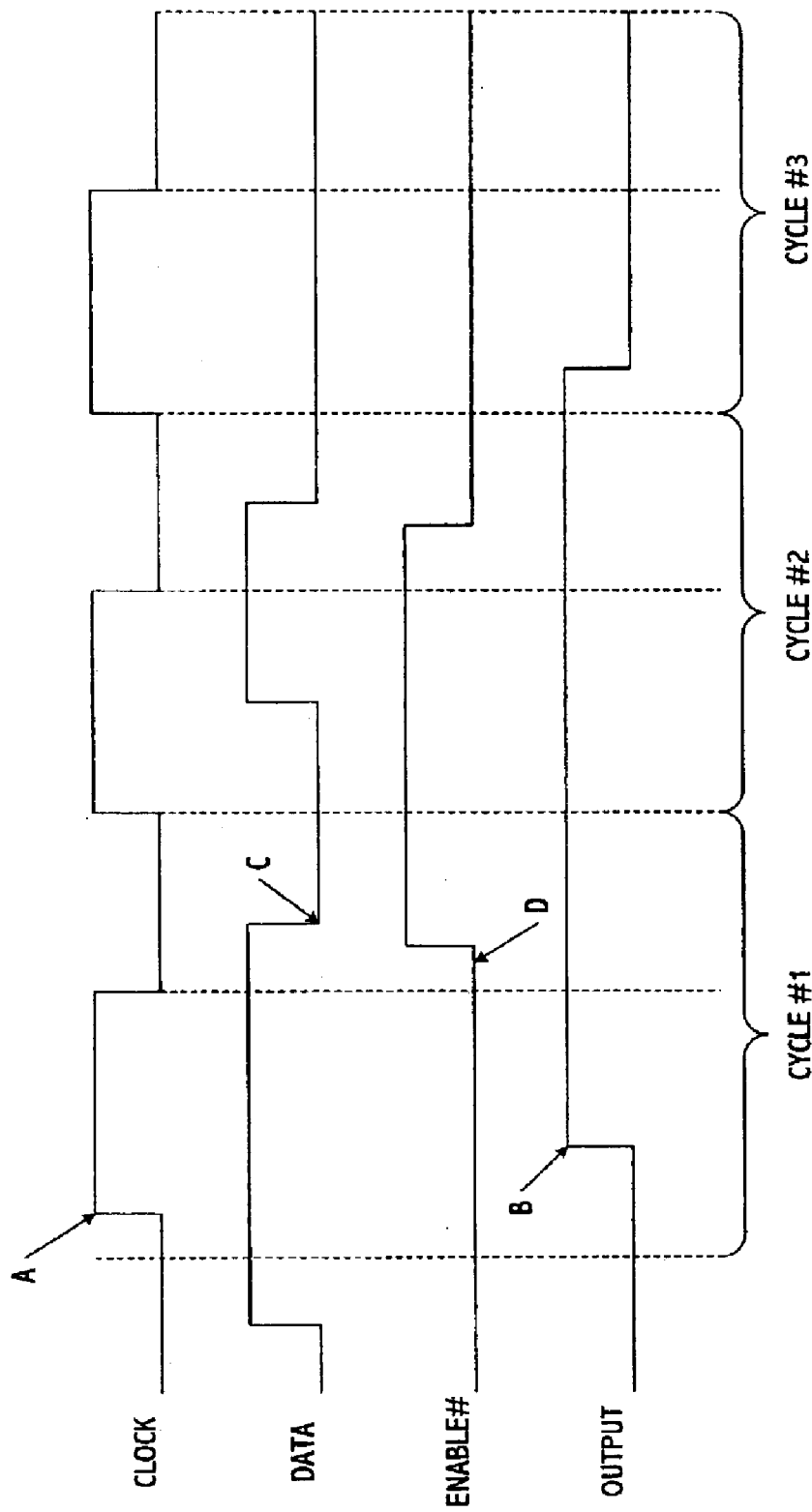
FIG. 2 is a timing diagram illustrating one way in which the flip-flop of FIG. 1 operates based on exemplary input values.

When the clock signal transitions from high to low while the data enable signal is high, the output of the NOR gate is a logical zero which causes the transmission gate to remain de-activated. Also, because the clock signal is low transmission gate 12 is de-activated and consequently no signal is output from the flip-flop. However, because the data enable signal is high, transmission gate 55 is activated to feedback the inverted value stored at node d2b in the slave keeper circuit to node d1 of the master keeper. This value is stored at node d1 until the clock transitions to high once again, at which time the inverted value at node d1b is passed as the output of the flip-flop FIG. 2 is a timing diagram showing the logical states of the static flip-flop circuit at various stages based on exemplary input values. In this diagram, the data enable signal is shown in its complementary form, namely Enable#. The timing diagram is partitioned into three operational cycles. During the first cycle, it is noted that data is set up before transition of the clock signal takes place. Since Enable # is low (the data enable signal is active) at the rising edge of the clock signal (at point A), the output of the flip-flop transitions to the data-captured state (at point B). During the second cycle, data changes from a high to a low logical value (a point C), but since the Enable# signal was deactivated (data enable signal transitions to high at point D), the output does not track the input. During the third cycle, it is noted that the Enable# signal went low (data enable signal transmissions to high) before the rising clock edge at the beginning of this cycle. As a result, the output transitions to the value captured on the rising clock edge.

The aforementioned embodiment of the static flip-flop of the present invention thus establishes a data-to-output path having two inversions and two pass gates in series. The data-enable control for this flip-flop gates a clock input with a data-enable input through a logical gate such as a NOR gate. This will ensure that the master transmission gate is only enabled when the data-enable signal is low. Under these circumstances, the slave portion of the circuit is enabled and the master is disabled on an up-going transition of the clock signal (e.g., when the clock signal transitions from low to high). Conversely, the slave portion is disabled and the master is enabled on a down-going transition of the clock signal (e.g,. when the clock signal transitions from high to low).

Also, in the aforementioned embodiment the logical value stored at sustain node d2b is fed back from the slave keeper to the master state node d1 through a transmission gate which is controlled by the data enable signal. Thus, when the data enable signal is high, the signal value in the slave is recycled into the storage node of the master portion of the circuit. Through this embodiment of the present invention, a static flip-flop may be modified to include a data-enable control circuit without adding any delay stages along the path connecting the data input and data output. As an advantageous result, data signals captured by this flip-flop are not delayed to any extent and thus the flip-flop circuit in accordance with the aforementioned embodiment of the present invention is well-suited to speed-critical applications.

Figure 3:
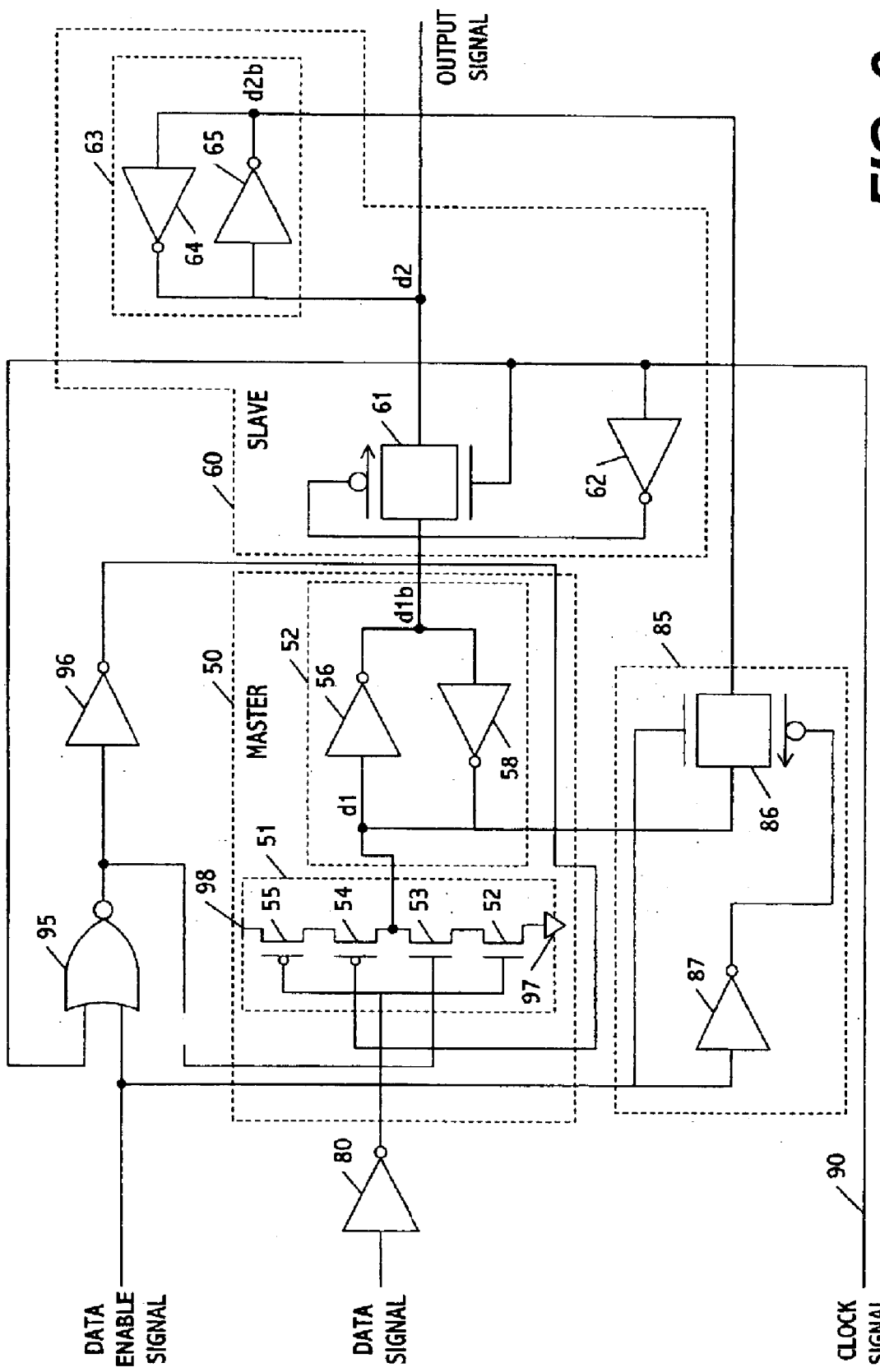
FIG. 3 is a diagram showing a flip-flop having a data-enable control circuit in accordance with another embodiment of the present invention.

FIG. 3 shows a static flip-flop circuit in accordance with another embodiment of the present invention. This circuit includes a master stage 50, a slave stage 60, and a data-enable control circuit. The master stage includes a totem-pole arrangement 51 of transistors connected to a keeper circuit 52, which is formed from inverters 56 and 58 connected in a loop. The slave stage includes a transmission gate 61, an inverter 62, and a keeper circuit 63. Transmission gate 61 has an input connected to the keeper circuit of the master stage and an output which corresponds to an output of the flip-flop circuit. The keeper circuit is formed from inverters 64 and 65 connected in a loop. One node d2 of the keeper is connected to the output of transmission gate 61, and an opposing inverted node d2b is connected to the output of a transmission gate included in the data-enable control circuit.

The data-enable control circuit synchronizes operation of the master and slave stages of the flip-flop circuit in association with a clock signal input along signal line 90. The data-enable control circuit includes a logic gate 95 and an inverter 96. The logic gate is preferably a NOR gate which includes as inputs a data enable signal and the input clock signal from line 90.

The flip-flop circuit may also include a feedback control circuit 85 which connects the slave keeper to the master keeper. The feedback control circuit includes a transmission gate 86 and an inverter 87. Operation of transmission gate 86 is controlled by the data enable signal input into the data-enable control circuit. This transmission gate has an input connected to the d2b node of the slave keeper and an output connected to the d1 node of the master keeper.

The flip-flop circuit of the second embodiment is similar to the first embodiment except that the transmission gate in the master stage is replaced by the totem-pole arrangement of transistors. This totem-pole arrangement includes two PMOS transistors 52 and 53 and two NMOS transistors 54 and 55 connected in series. The gates of transistors 52 and 55 are connected to the data signal input through an inverter 80, the gate of transistor 53 is connected to the output of NOR gate 95, and the gate of transistor 54 is connected to the output of inverter 96, which inverts the output of the NOR gate. Transistor 52 may be connected to a reference potential 97 such as ground and transistor 55 may be connected to a supply potential 98.

Operation of the second embodiment of the static flip-flop circuit will now be discussed for each of the four possible logical values the data enable and clock signals may assume.

When the clock and data enable signals are both low (e.g., logical zero), the output of NOR gate 40 is high (e.g., logical one). This value is input into the non-inverting terminal of transistor 53 and a logical zero value is input into the inverting terminal of transistor 54 as a result of the output from inverter 96. These values cause a voltage corresponding to a logical value of the data signal to pass to node d1, where it is maintained by keeper circuit 52 of the master portion of the flip-flop. Specifically, if the data signal has a logical zero value, inverter 80 outputs a logical one value, which switches transistor 52 on and transistor 55 off. As a result, a value based on reference potential 97 (which is a logical zero value) is input into node d1. Conversely, if the data signal has a logical one value, inverter 80 outputs a logical zero value, which switches transistor 55 on and transistor 52 off. As a result, a value based on supply potential 98 is input into node d1. Because the clock signal is low, transmission gate 61 does not pass the inverted logical value stored at node d1b to the output of the flip-flop. Also, because the data-enable signal is low, transmission gate 86 is not activated and thus does not pass the logical value stored at keeper circuit 63 of the slave portion of the flip-flop to node d1.

When the clock signal transitions from low to high while the data enable signal is low, the output of the NOR gate is a logical zero which switches transistor 53 off and the output of inverter 96 is a logical one which switches transistor 54 off. However, a logical value of one is input into the non-inverting terminal of transmission gate 61 and a logical value of zero is input into the inverting terminal of this gate. As a result, the inverted logical value stored at node d1b is passed from the slave portion of the circuit to node d2, which corresponds to the output of the flip-flop. The logical value at node d2 is stored in keeper circuit 63 of the slave. However, because the data enable signal is low transmission gate 86 remains de-activated and the logical value stored in the slave keeper is not fed back to node d1 of the master keeper. Incidentally, it is noted that the low value of the data enable signal switches transistor 55 off and transistor 52 on. These transistors, however, are effectively disconnected from node d1 by the deactivation of transistors 53 and 54.

When the clock signal transitions from low to high while the data enable signal is high, the output of the NOR gate is a logical zero which switches transistor 53 off and the output of inverter 96 is a logical one which switches transistor 54 off. However, a logical value of 1 is input into the non-inverting terminal of transmission gate 61 and a logical value of zero is input into the inverting terminal of this gate. As a result, the inverted logical value stored at node d1b is passed from the slave portion of the circuit to node d2, which corresponds to the output of the flip-flop. The logical value at node d2 is stored in keeper circuit 63 of the slave. Because the data enable signal is high, a logical one is input into the non-inverting terminal of transmission gate 86 is activated and a logical zero is input into the inverting terminal of this gate. As a result, transmission gate 86 is activated, thereby feeding back the inverted value stored in slave keeper circuit 63 to node d1 of the master keeper.

When the clock signal transitions from high to low while the data enable signal is high, the output of the NOR gate is a logical zero which causes transistor 53 to switch off and the output of the inverter 96 is a logical one which causes transistor 54 to switch off. Also, because the clock signal is low transmission gate 61 is de-activated and consequently no signal is output from the flip-flop. However, because the data enable signal is high, transmission gate 86 is activated to feedback the inverted value stored at node d2b in the slave keeper circuit to node d1 of the master keeper. This value is stored at node d1 until the clock transitions to high once again, at which time the inverted value at node d1b is passed as the output of the flip-flop.

Figure 4:
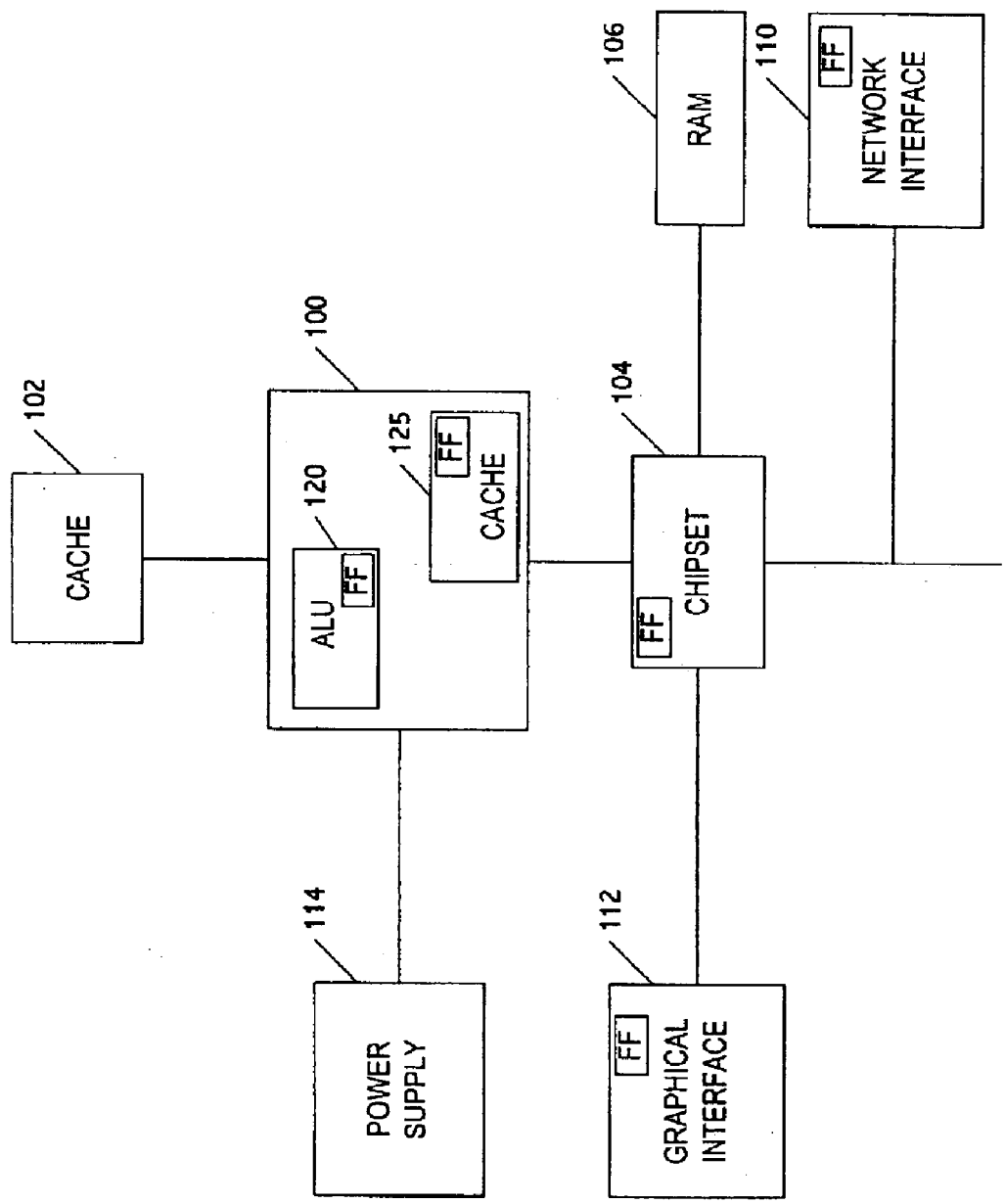
FIG. 4 is a diagram showing a processing system which may include a data-enabled control circuit in accordance with the embodiment of the invention shown in FIG. 1.

FIG. 4 shows a processing system in accordance with one embodiment of the present invention. The processing system includes a processor 100 such as but not limited to a microprocessor, an optional cache 102, an optional chipset 104, a memory 106 such as but not limited to a random access memory, an optional network interface 110, an optional graphical interface 112, and a power supply 114. The processor may contain, for example, an arithmetic logic unit (ALU) 120 and an internal cache 125. As shown, any one or more of the ALU, cache, chipset, graphical interface, and network interface may include a flip-flop 400 in accordance with any of the embodiments of the present invention described herein for purposes of, for example, performing a static-storage function, with condition control through the data enable (or Enable#) signal.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A flip-flop circuit, comprising:
   a first stage;
   a second stage connected to the first stage; and
   a controller to feed back a value stored in the second stage to a storage node of the first stage based on a data enable signal, wherein the controller feeds back the value stored in the second stage to said storage node of the first stage independent of a clock signal which at least partially controls transfer of data to the first and second stages, and wherein the first stage is activated based on the data enable signal and clock signal and the second stage is activated based on the clock signal independent from the data enable signal.

2. The flip-flop circuit of claim 1, wherein the second stage passes the value fed back to said storage node as an output of the flip-flop circuit.

3. The flip-flop circuit of claim 2, wherein the second stage passes the value fed back to said storage node as an output of the flip-flop circuit at a time when the first stage is deactivated.

4. The flip-flop circuit of claim 1, wherein the controller controls activation of the first stage based on the data enable signal.

5. The flip-flop circuit of claim 4, wherein the controller feeds back the value stored in the second stage to said storage node at a time when the first stage has been deactivated by the controller.

6. The flip-flop circuit of claim 4, wherein the second stage is activated by the clock signal.

7. The flip-flop circuit of claim 1, wherein the first stage includes a switch which passes a data input value to said storage node during a time when the second stage is deactivated.

8. The flip-flop of claim 7, wherein the switch includes a transmission gate.

9. A flip-flop circuit, comprising:
a first stage;
a second stage connected to the first stage; and
a controller to feed back a value stored in the second stage to a storage node of the first stage based on a data enable signal, wherein the first stage includes a switch which passes a data input value to said storage node during a time when the second stage is deactivated and wherein the switch includes a plurality of transistors connected in series, said transistors including:
a first transistor electrically coupled to a reference potential and activated by a data signal;
a second transistor coupled to the first transistor and activated based on the data enable signal;
a third transistor coupled to the second transistor and activated based on the data enable signal; and
a fourth transistor coupled between the third transistor and a supply potential and activated by the data signal.

10. The flip-flop circuit of claim 9, wherein the first and second transistors are activated to store a first logical value of the data signal at said storage node, and wherein the third and fourth transistors are activated to store a second logical value of the data signal at said storage node.

11. The flip-flop circuit of claim 10, wherein the first logical value is a logical zero and the second logical value is a logical one.

12. The flip-flop circuit of claim 1, wherein the controller includes:
a switch connected between a storage node of the second stage and said storage node of the first stage, said switch activated by the data enable signal.

13. The flip-flop circuit of claim 12, wherein said switch includes a transmission gate.

14. The flip-flop circuit of claim 1, wherein the controller controls activation of the first stage based on the data enable signal and clock signal, and wherein activation of the second stage is controlled based on the clock signal and independent from the data enable signal.

15. A control circuit for a flip-flop, comprising:
a first controller to control activation of a first stage of the flip-flop;
a second controller to control activation of a second stage of the flip-flop; and
a third controller to feed back a value stored in the second stage to a storage node between the first stage and the second stage based on a data enable signal, wherein the third controller feeds back the value stored in the second stage to said storage node of the first stage independent of a clock signal which at least partially controls transfer of data to the first and second stages.

16. The control circuit of claim 15, wherein the first controller controls the first stage based on the data enable signal.

17. The control circuit of claim 15, wherein the first controller controls activation of the first stage based on the data enable signal and the clock signal.

18. The control circuit of claim 15, wherein the second controller controls activation of the second stage based on a clock signal and independent of the data enable signal.

19. The control circuit of claim 15, wherein the third controller feeds back the value stored in the second stage to said storage node at a time when the first stage is deactivated by the first controller and the second stage is activated by the second controller.

20. A method for controlling a flip-flop, comprising:
receiving a data enable signal; and
feeding back a value stored in a second stage of the flip-flop to a storage node of a first stage of the flip-flop based on the data enable signal, wherein the value stored in the second stage is fed back to said storage node of the first stage independent of a clock signal which at least partially controls transfer of data to the first and second stages, the method further comprising:
controlling activation of the first stage based on the data enable signal and clock signal, and controlling activation of the second stage is controlled based on the clock signal independent from the data enable signal.

21. The method of claim 20, further comprising:
passing the value fed back to said storage node to an output of the flip-flop.

22. The method of claim 21, wherein the value fed back to said storage node is passed to the output of the flip-flop at a time when the first stage is deactivated.

23. The method of claim 20, further comprising:
controlling activation of the first stage based on the data enable signal.

24. The method of claim 23, further comprising:
deactivating the first stage at a time when the value stored in the second stage is fed back to said storage node.

25. The method of claim 23, further comprising:
controlling activation of the second stage based on the clock signal.

26. A system, comprising:
a circuit; and
a flip-flop included in the circuit, said flip-flop comprising a first stage, a second stage connected to the first stage, and a controller to feed back a value stored in the second stage to a storage node of the first stage based on a data enable signal,
wherein the controller feeds back the value stored in the second stage to said storage node of the first stage independent of a clock signal which at least partially controls transfer of data to the first and second stages, and wherein the first stage is activated based on the data enable signal and clock signal and the second stage is activated based on the clock signal independent from the data enable signal.

27. The system of claim 26, wherein the circuit is one of a processing unit, a data storage unit, and an interface.

28. The system of claim 27, wherein the data storage unit is one of a RAM and a cache.

29. The system of claim 27, wherein the interface is one of a graphical interface and a network interface.

30. A flip-flop circuit, comprising:
a first stage;
a second stage connected to the first stage;
a logic circuit to generate a control signal based on a data enable signal and a clock signal, wherein the control signal controls transfer of data into the first stage and the clock signal controls transfer of data from the first stage to the second stage; and
a controller to feed back data stored in the second stage to a storage node of the first stage based on the data enable signal.

31. The circuit of claim 30, wherein the first stage includes:
a first transmission gate; and
a first keeper circuit having a storage node coupled to the first transmission gate,
wherein the first transmission gate transfers data to the storage node of the first keeper circuit based on the control signal.

32. The circuit of claim 31, wherein the control signal transfers data to the storage node of the first keeper circuit when the data enable signal and the clock signal have a same value.

33. The circuit of claim 31, wherein the second stage includes:
a second transmission gate; and
a second keeper circuit having a storage node coupled to the first keeper circuit,
wherein the second transmission gate transfers data from the first keeper circuit to the second keeper circuit based on the clock signal.

34. The circuit of claim 30, wherein the logic circuit includes a NOR gate.

35. A flip-flop circuit, comprising:
a first stage;
a second stage connected to the first stage; and
a logic circuit to generate a control signal based on a data enable signal and a clock signal, wherein the control signal controls transfer of data into the first stage and the clock signal controls transfer of data from the first stale to the second stage, and a controller feeds back the data stored in the second stage to a storage node of the first stage independent of the clock signal.

36. The circuit of claim 35, wherein the controller includes:
a transmission gate which transfers the data stored in the second stage to the storage node of the first stage.

37. The circuit of claim 36, wherein the transmission gate transfers the data to the storage node of the first stage when the data enable signal assumes a first value and wherein data is transferred to the storage node of the first stage when the data enable signal assumes a second value.

38. The circuit of claim 30, wherein the control signal transfers data to the first stage when the data enable signal and the clock signal assume a first value, and wherein data is transferred from the first stage to the second stage when the clock signal assumes a second value.

39. A method for controlling a flip-flop, comprising:
generating a control signal based on a data enable signal and a clock signal;
controlling transfer of data into a first stage of the flip-flop based on the control signal;
controlling transfer of data from the first stage to the second stage based on the clock signal; and
feeding back data stored in the second stage to a storage node of the first stage based on the data enable signal.

40. The method of claim 39, wherein the first stage includes a first transmission gate which transfers data to a keeper circuit of the first stage based on the control signal.

41. The method of claim 40, wherein the control signal transfers data to the keeper circuit when the data enable signal and the clock signal have a same value.

42. The method of claim 40, wherein the second stage includes a second transmission gate which transfers data from the keeper circuit of the first stage to a keeper circuit of the second stage based on the clock signal.

43. The method of claim 39, wherein generating the control signal is performed by a logic gate which includes a NOR gate.

44. A method for controlling a flip-flop, comprising:
generating a control signal based on a data enable signal and a clock signal;
controlling transfer of data into a first stage of the flip-flop based on the control signal; and
controlling transfer of data from the first stage to the second stage based on the clock signal, wherein the data stored in the second stage is fed back to a storage node of the first stage independent of the clock signal.

45. The method of claim 44, wherein the controller includes a transmission gate which transfers the data stored in the second stage to the storage node of the first stage.

46. The method of claim 45, wherein the transmission gate transfers the data to the storage node of the first stage when the data enable signal assumes a first value and wherein data is transferred to the storage node of the first stage when the data enable signal assumes a second value.

47. The method of claim 39, wherein the control signal transfers data to the first stage when the data enable signal and the clock signal assume a first value, and wherein data is transferred from the first stage to the second stage when the clock signal assumes a second value.

* * * * *